(12) United States Patent
Ambo et al.

(10) Patent No.: US 7,295,143 B2
(45) Date of Patent: Nov. 13, 2007

(54) SEMICONDUCTOR INTEGRATED CIRCUIT DEVICE

(75) Inventors: Takanobu Ambo, Tokyo (JP); Eiki Imaizumi, Tokyo (JP); Satoshi Jimbo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/494,517

(22) Filed: Jul. 28, 2006

(65) Prior Publication Data

US 2007/0030262 A1   Feb. 8, 2007

(30) Foreign Application Priority Data

Aug. 3, 2005   (JP) .............................. 2005-224795

(51) Int. Cl.
*H03M 1/12* (2006.01)
(52) U.S. Cl. .......................... 341/172; 341/155; 330/9; 348/241; 348/243
(58) Field of Classification Search ................. 341/172
See application file for complete search history.

(56) References Cited

U.S. PATENT DOCUMENTS

| | | | | |
|---|---|---|---|---|
| 6,166,367 A | * | 12/2000 | Cho | ........................ 250/208.1 |
| 6,342,919 B2 | | 1/2002 | Opris | |
| 6,445,331 B1 | * | 9/2002 | Stegers | ........................ 341/172 |
| 6,529,237 B1 | * | 3/2003 | Tsay et al. | ................... 348/241 |
| 6,587,143 B1 | * | 7/2003 | Boisvert | ...................... 348/241 |
| 6,897,720 B2 | * | 5/2005 | Fujimoto | ........................ 330/9 |
| 7,088,273 B1 | * | 8/2006 | Perdoor et al. | ............. 341/120 |

FOREIGN PATENT DOCUMENTS

JP   2002-542679   12/2002

* cited by examiner

*Primary Examiner*—Khai M. Nguyen
(74) *Attorney, Agent, or Firm*—Mattingly, Stanger, Malur & Brundidge, PC

(57) ABSTRACT

There is a need for providing a variable amplifier circuit suited for a semiconductor integrated circuit and a high-performance camera preprocessing LSI using the variable amplifier circuit. At first timing, a first input capacitor acquires a first signal. An amplifier circuit amplifies a second signal acquired to the second input capacitor according to a gain corresponding to a capacity ratio between the second input capacitor and a feedback capacitor composed of a variable capacitor device. At second timing, the second input capacitor acquires a second signal. The amplifier circuit amplifies the first signal according to a gain corresponding to a capacity ratio between the first input capacitor and the feedback capacitor. A variable gain amplifier circuit interleavingly amplifies the first signal and the second signal in synchronization with the first timing and the second timing.

11 Claims, 10 Drawing Sheets

SEMICONDUCTOR INTEGRATED CIRCUIT DEVICE

CROSS-REFERENCE TO RELATED APPLICATION

The present application claims priority from Japanese patent application No. 2005-224795 filed on Aug. 3, 2005, the content of which is hereby incorporated by reference into this application.

BACKGROUND OF THE INVENTION

The present invention relates to a semiconductor integrated circuit device, e.g., a technology effectively used for a camera preprocessing LSI (AFE, Analog Front End) having a variable amplifier circuit such as a correlated double sampling (CDS) circuit or a programmable gain amplifier (PGA).

For example, Japanese Unexamined Patent Publication No. 2002-542679 each of the above-mentioned CDS, PGA, and ADC (analog-digital converter) has two sets of input units and common amplifier circuits and performs interleave operation to process signals from an image sensor.

[Patent document 1] Japanese Unexamined Patent Publication No. 2002-542679

SUMMARY OF THE INVENTION

Patent document 1 above describes that the amplifier circuit sets a gain according to a capacity ratio. However, an interleave operation alternately amplifies a pixel signal due to gains according to two sets of capacity ratios. When the two sets of capacity ratios differ from each other, gains for adjacent pixels slightly differ from each other. A fixed pattern noise may occur on the screen. Especially when circuit devices formed on a semiconductor integrated circuit device are used for fine gain control, for example, switches may be parallel connected to construct a variable capacitor device. It is actually difficult to obtain a minute capacity that causes the same change in the two sets.

It is an object of the present invention to provide a variable amplifier circuit suited for a semiconductor integrated circuit and a high-performance camera preprocessing LSI using the variable amplifier circuit. These and other objects and novel features of the invention may be readily ascertained by referring to the following description and appended drawings.

The following summarizes representative embodiments of the invention disclosed in this application. At first timing, a first input capacitor acquires a first signal. An amplifier circuit amplifies a second signal acquired to the second input capacitor according to a gain corresponding to a capacity ratio between the second input capacitor and a feedback capacitor composed of a variable capacitor device. At second timing, the second input capacitor acquires a second signal. The amplifier circuit amplifies the first signal according to a gain corresponding to a capacity ratio between the first input capacitor and the feedback capacitor. A variable gain amplifier circuit interleavingly amplifies the first signal and the second signal in synchronization with the first timing and the second timing.

Since two input capacitors share a variable capacitor device as a feedback capacitor, it is possible to provide gain uniformity during interleave operation.

DETAILED DESCRIPTION OF THE PREFERRED EMBODIMENTS

Figure 1:
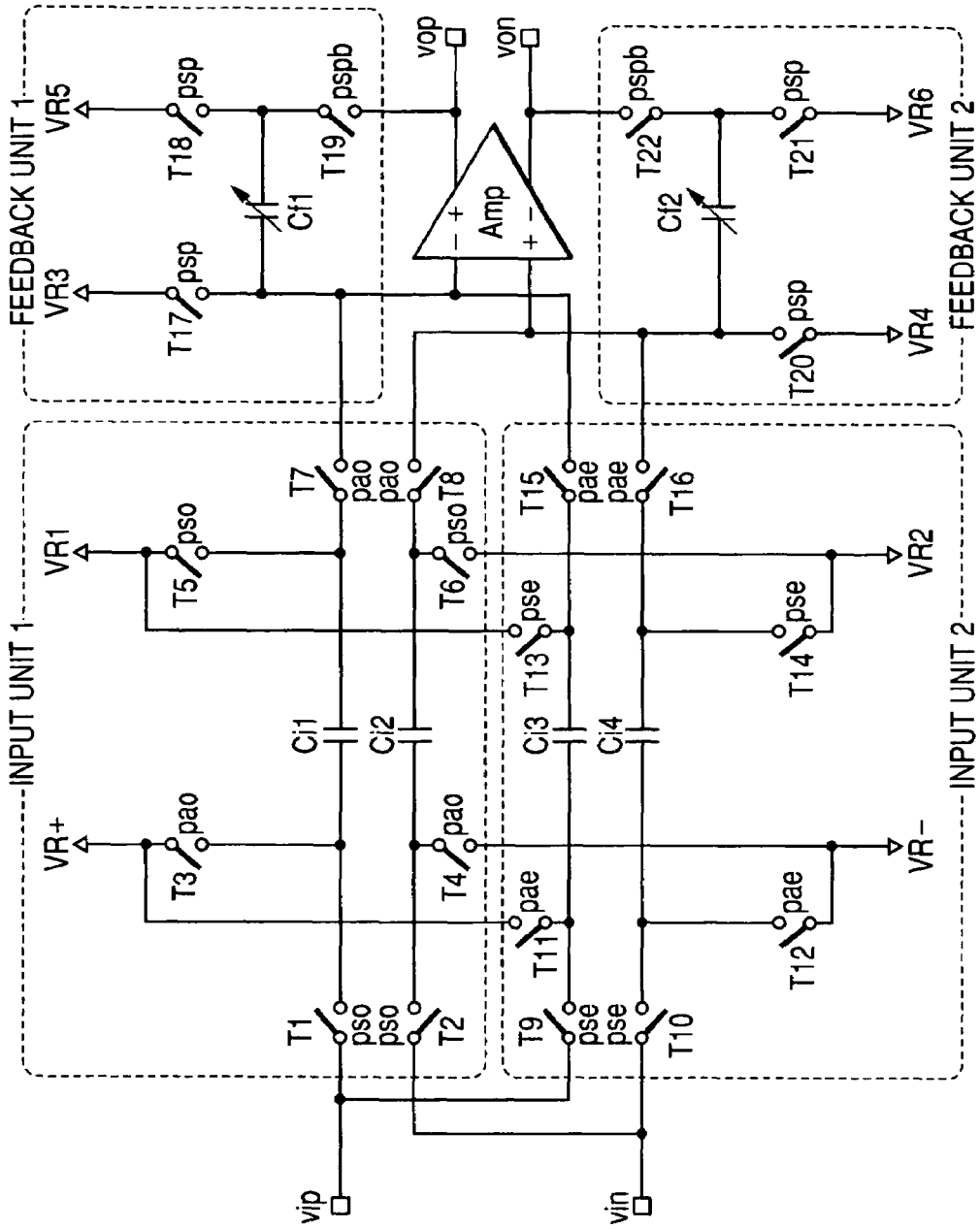
FIG. 1 is a circuit diagram showing an embodiment of a variable gain amplifier circuit according to the invention.

FIG. 1 provides a circuit diagram showing an embodiment of a variable gain amplifier circuit according to the invention. A known technology to manufacture semiconductor integrated circuits is used to fabricate the variable gain amplifier circuit according to the embodiment. The variable gain amplifier circuit is profitably mounted on a camera preprocessing LSI (AFE, Analog Front End) having variable amplifier circuits such as a correlated double sampling (CDS) circuit and a programmable gain amplifier (PGA).

The variable gain amplifier circuit according to the embodiment constructs the PGA including: a fully differential amplifier Amp that is mounted on the AFE and has two inputs (positive and negative) and two outputs (positive and negative); and circuit blocks enclosed in dotted lines such as an input unit 1, an input unit 2, a feedback unit 1, and a feedback unit 2. The input 1 is composed of switches T1 through T8 and capacitors Ci1 and Ci2. The input 2 is composed of switches T9 through T16 and capacitors Ci3 and Ci4. The feedback unit 1 is composed of switches T17 through T19 and a feedback capacitor Cf1. The feedback unit 2 is composed of switches T20 through T22 and a feedback capacitor Cf2. Further, vip and vin denote differential inputs (positive terminal p and negative terminal n) and are formed in synchronization with clock pulses from a preceding correlated double sampling (CDS) circuit. Further, vop and von denote output signals from the differential outputs. VR+, VR−, and VR1 through VR6 denote reference voltages.

The input unit 1 is constructed as follows. The input signals vip and vin are supplied to one of electrodes of the input capacitors (capacities) Ci1 and Ci2 through the switches T1 and T2. The switches T3 and T4 are provided between electrodes of the capacitors Ci1 and Ci2 and the reference voltages VR+ and VT−, respectively. The switches T5 and T6 are provided between the other electrodes of the capacitors Ci1 and Ci2 and the reference voltages VR1 and VT2, respectively. The switches T7 and T8 are provided between the other electrodes of the capacitors Ci1 and Ci2 and the differential inputs (negative and positive) of the fully differential amplifier, respectively.

The input unit 2 is constructed similarly to the input unit 1 as follows. The input signals vip and vin are supplied to one of electrodes of the input capacitors (capacities) Ci3 and Ci4 through the switches T9 and T10. The switches T11 and T12 are provided between electrodes of the capacitors Ci3 and Ci4 and the reference voltages VR+ and VT−, respectively. The switches T13 and T14 are provided between the other electrodes of the capacitors Ci3 and Ci4 and the reference voltages VR1 and VT2, respectively. The switches T15 and T16 are provided between the other electrodes of the capacitors Ci3 and Ci4 and the differential inputs (negative and positive) of the fully differential amplifier, respectively.

The feedback capacitor Cf1 of the feedback unit 1 is composed of a variable capacitor device. One electrode of the capacitor Cf1 is connected to the input (negative) of the fully differential amplifier Amp. The other electrode of the capacitor Cf1 is connected to the output (positive) of the fully differential amplifier Amp via the switch T19. The switch T17 is provided between the input (negative) of the fully differential amplifier and the reference voltage VR3. The switch T18 is provided between the other electrode of the feedback capacitor Cf1 and the reference voltage VR5. The feedback capacitor Cf2 of the feedback unit 2 is composed of a similar variable capacitor device. One electrode of the capacitor Cf2 is connected to the input (positive) of the fully differential amplifier Amp. The other electrode of the capacitor Cf2 is connected to the output (negative) of the fully differential amplifier Amp via the switch T22. The switch T20 is provided between the input (positive) of the fully differential amplifier and the reference voltage VR4. The switch T21 is provided between the other electrode of the feedback capacitor Cf2 and the reference voltage VR6. Though not specified, the switches T1 and T2 represent CMOS circuits composed of parallel connected P-channel MOSFETs and N-channel MOSFETs.

Figure 2:
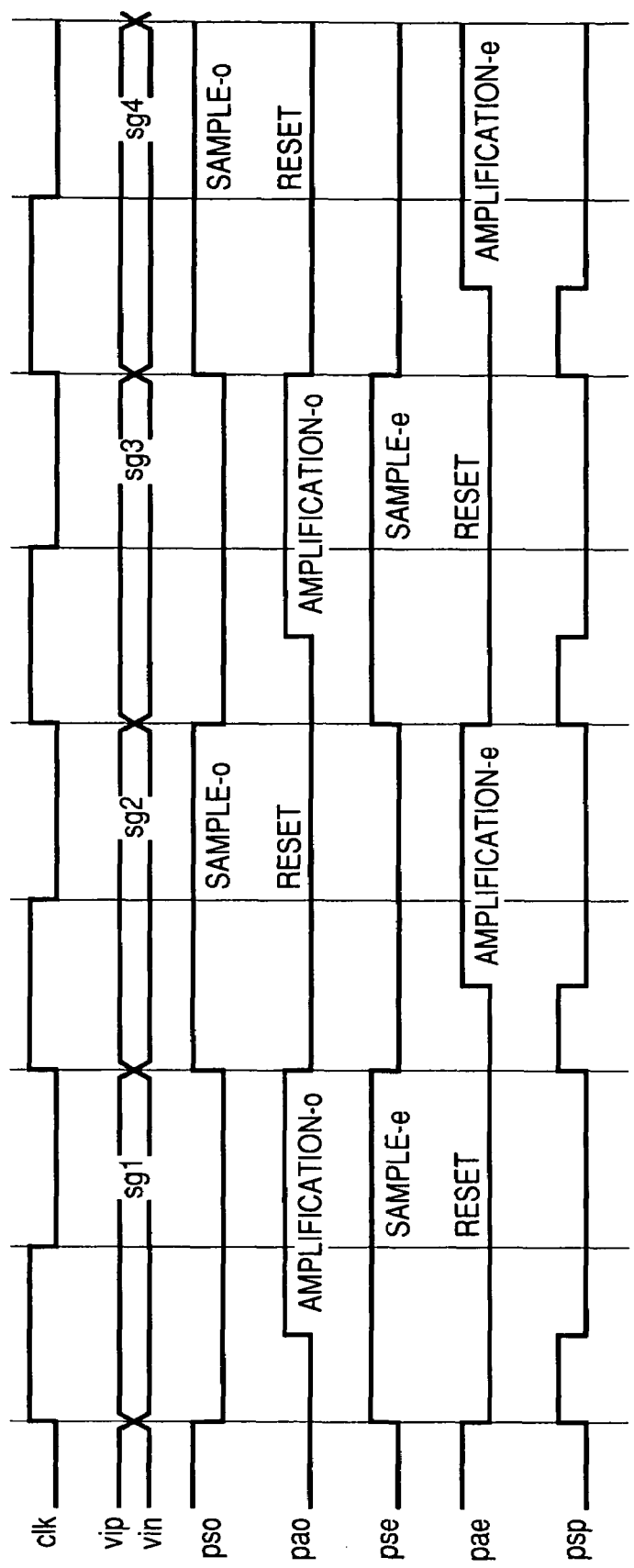
FIG. 2 is a timing chart illustrating an example of operation of the variable gain amplifier circuit in FIG. 1.

FIG. 2 provides a timing chart illustrating an example of operation of the variable gain amplifier circuit in FIG. 1. The input unit 1 and the input unit 2 are alternately used at first and second timings synchronized with a clock pulse clk. Control signal pso controls the switches T1, T2, T5, and T6 of the input unit 1. Control signal pao controls the switches T3, T4, T7, and T8. Control signal pse controls the switches T9, T10, T13, and T14 of the input unit 2. Control signal pae controls the switches T11, T12, T15, and T16. Control signal psp controls the switches T17, T18, T20, and T22 of the feedback units 1 and 2. Control signal pspb controls the switches T19 and T21. The control signal pspb is phased opposite to the control signal sps. The control signal ends with letter o indicating odd-numbered timing (e.g., first timing) or with letter e indicating even-numbered timing (e.g., second timing).

At the first timing corresponding to the first cycle of the clock pulse clk, the control signal Pse turns on the switches T9, T10, T13, and T14 to sample input signal sg1 in the input capacitors Ci3 and Ci4. The input signal sg1 is supplied to the input terminals vip and vin. At the first timing, the input unit 1, the feedback units 1 and 2 amplify input signals that are acquired to the input capacitors Ci1 and Ci2 at the most recent timing.

At the second timing corresponding to the second cycle of the clock pulse clk, the control signal pse turns off the switches T9, T10, T12, and T13. At the same time, the control signal psp turns on the switches T17, T18, T20, and T21. The feedback capacities Cf1 and Cf2 are reset at the reference voltages VR3, VR5, VR4, and VT6. At the same second timing, the control signal psp turns off the switches T17, T18, T20, and T21. The control signal pspb turns on the switches T19 and T22. At the same time, the control signal pae turns on the switches T11, T12, T15, and T16. A difference between the reference voltages VR+ and VR− is added to the input signal sg1 that is acquired at the first timing corresponding to the first cycle of the clock pulse clk. The fully differential amplifier Amp performs amplification. As an additional effect, the offset cancellation is also available by providing the reference voltages VR+ and VR− with a difference corresponding to an offset cancellation voltage of the fully differential amplifier Amp.

At the second timing corresponding to the second cycle of the clock pulse clk, the input unit 2 and feedback units 1 and 2 perform the above-mentioned amplification. Concurrently with this amplification, the control signal pse turns off the switches T11, T12, T15, and T16 to terminate sampling of the input signal sg1. After this sampling, the control signal pso turns on the switches T1, T2, T5, and T6 to sample input signal sg2 in the input capacitors Ci1 and Ci2. The input signal sg2 is applied to the input terminals vip and vin.

At the first timing corresponding to the third cycle of the clock pulse clk, the control signal pso turns off the switches T1, T2, T5, and T6. At the same time, the control signal psp turns on the switches T17, T18, T20, and T21 similarly to the above. The feedback capacities Cf1 and Cf2 are reset at the reference voltages VR3, VR5, VR4, and VT6. At the same third timing, the control signal psp turns off the switches T17, T18, T20, and T21. At the same time, the control signal pao turns on the switches T3, T4, T7, and T8. A difference between the reference voltages VR+ and VR− is added to the input signal sg2 for amplification.

At the first timing corresponding to the third cycle of the clock pulse clk, the control signal pso turns off the switches T1, T2, T5, and T6 to terminate sampling of the input signal sg2 concurrently with the amplification by means of the input unit 1 and the feedback units 1 and 2. After the sampling, the control signal pse turns on the switches T9, T10, T13, and T14 to sample input signal sg3 in the input capacitors Ci3 and Ci4. The input signal sg3 is supplied to the input terminals vip and vin.

In this manner, the variable gain amplifier circuit in FIG. 1 performs sampling and amplification in an interleave fashion. That is, at an even-numbered cycle of the clock pulse clk, the first input unit performs sampling and the second input unit, the feedback units 1 and 2, and the differential amplifier unit perform amplification. At an odd-numbered cycle, the second input unit performs sampling and the first input unit, the feedback units 1 and 2, and the differential amplifier unit perform amplification.

The reference voltage VR+ or VR− is a bias voltage approximately half the differential amplifier circuit's power supply voltage so as to maximize the dynamic range for output signals. The reference voltages VR+ and VR− are equally configured when the above-mentioned offset cancellation is not performed. Though not specified, the reference voltages VR3 through VR6 are also configured to be bias voltages compliant with the above-mentioned amplification operation points so as to reduce effects of a parasitic capacity and the like between the input and output nodes of the differential amplifier unit and the ground potential of the circuit.

Figure 3:
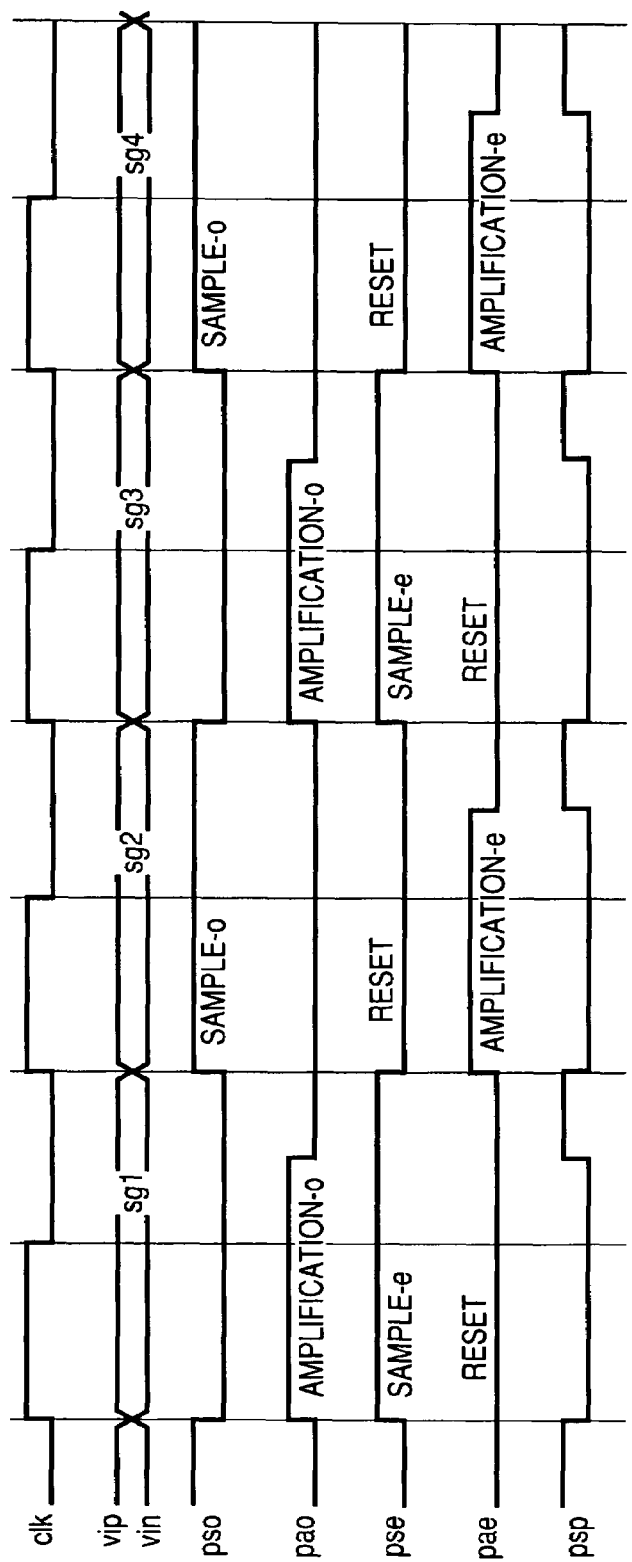
FIG. 3 is a timing chart illustrating another example of operation of the variable gain amplifier circuit in FIG. 1.

FIG. 3 provides a timing chart illustrating another example of operation of the variable gain amplifier circuit in FIG. 1. The embodiment in FIG. 3 resets the feedback units 1 and 2 after the amplification at a given timing so as to be ready for the next amplification. The embodiment in FIG. 2 resets the feedback capacitors Cf1 and Cf2 before the amplification. By contrast, the embodiment in FIG. 3 resets the feedback capacitors Cf1 and Cf2 after the amplification as mentioned above, making immediate amplification possible at the next timing. That is, the control signal psp is generated at the end of the clock pulse clk. In response to this, the control signals pao and pae complete the amplification before the control signal psp starts resetting the feedback capacitors Cf1 and Cf2 from the beginning of the clock pulse clk.

Figure 4:
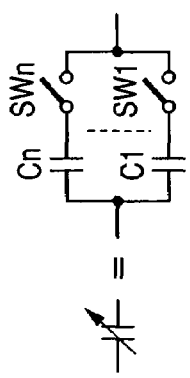
FIG. 4 is a circuit diagram showing an embodiment of a feedback capacitor.

FIG. 4 provides a circuit diagram showing an embodiment of the feedback capacitor. The feedback capacitor is composed of capacitors C1 through Cn and switches SW1 through SWn for parallel connecting the capacitors. Though not specified, when a binary digital signal controls the switches SW1 through SWn to construct the variable capacity, the capacitors C1 through Cn are formed so that its capacitance values have binary weights. Though not specified, the switches SW1 through SWn are CMOS switches composed of P-channel MOSFETs and N-channel MOSFETs parallel connected to each other.

In FIG. 1, the use of the interleave and the shared amplification enables the PGA to accelerate the throughput and reduce the power consumption. The variable feedback capacities Cf1 and Cf2 degrade the capacity ratio accuracy. Using only one set of the variable feedback capacities Cf1 and Cf2 can restrain the accuracy from degrading even in the interleave system that contains multiple signal paths. That is, it is only necessary to configure the accuracy of the capacity ratios between the input capacitors Ci1 and Ci3 and between Ci2 and Ci4. As will be described later, the semiconductor integrated circuit device manufacturing technology can increase the relative ratio. Only one set of the feedback capacitors Cf1 and Cf2 can restrain the circuit scale from increasing. To form a variable capacitor device as shown in FIG. 4, the feedback capacitors Cf1 and Cf2 are composed of the multiple capacitors C1 through Cn and switches SW1 through SWn and occupy a relatively large area. The circuit can be scaled down by decreasing the capacitors and the switches to two sets.

This embodiment provides two sets of input capacitors and switches and one set of feedback capacitors with variable capacitance values for the switched-capacitor PGA. While one set of input capacitors samples signals, the interleave operation is performed to reset the feedback capacitors and allow the amplifier for amplification. The interleave operation can extend a period to sample input signals. This can extend the amplification time for the preceding amplifier. It is possible to relieve band requirements for the differential amplifier circuit Amp constituting the PGA by shortening the reset time for the feedback capacitors and extending the PGA amplification time. The band of the differential amplifier circuit Amp is proportional to gm of the input transistor and gm is proportional to a square root of the consumption current. When the band needed for the differential amplifier circuit Amp becomes a half, for example, the consumption current becomes a quarter. Accordingly, the interleave relieves band requirements for the amplifier and makes it possible to decrease the power consumption. On the other hand, the reset time depends only on on-resistances of the switches T17, T18, T20, and T21 and sizes of the feedback capacitors Cf1 and Cf2. Adjusting the switch sizes of MOSFETs constituting the switches T17, T18, T20, and T21 can decrease the on-resistances and shorten the reset time.

The differential amplifier circuit Amp is not used while a signal is sampled. The shared amplification can be used to share the differential amplifier circuit Amp during amplification operations and further decrease the power consumption. On the other hand, the interleave operation uses multiple signal paths. A mismatch between the devices available between the paths degrades the accuracy. However, a fixed capacitance value is used for the input capacitor. Gains are switched by varying capacitance values of one set of feedback capacitors. The fixed input capacitor and the switch may only cause a mismatch. At the layout stage, setting a large unit capacity can decrease a mismatch between sizes and minimize the accuracy degradation. The use of one set of feedback capacitors can restrain the circuit scale from increasing.

According to the technology described in patent document 1, the interleave operation causes multiple signal paths. A device mismatch between signal paths degrades the accuracy. By contrast, the invention uses the shared amplification to share the differential amplifier circuit Amp. There is no need to take into consideration an offset in the differential amplifier circuit Amp. The invention uses only one set of feedback capacitors Cf1 and Cf2. It is only necessary to consider the accuracy of the capacity ratios between the input capacitors Ci1 and Ci3 and between Ci2 and Ci4 as protection against a capacity mismatch during the interleave operation. Fixed capacitance values are used for the input capacitors Ci1, Ci3, Ci2, and Ci4. At the layout stage, setting a large unit capacity can minimize a mismatch between the input capacitors Ci1 and Ci3 and between Ci2 and Ci4. It is possible to minimize accuracy degradation during the interleave operation.

Figure 5:
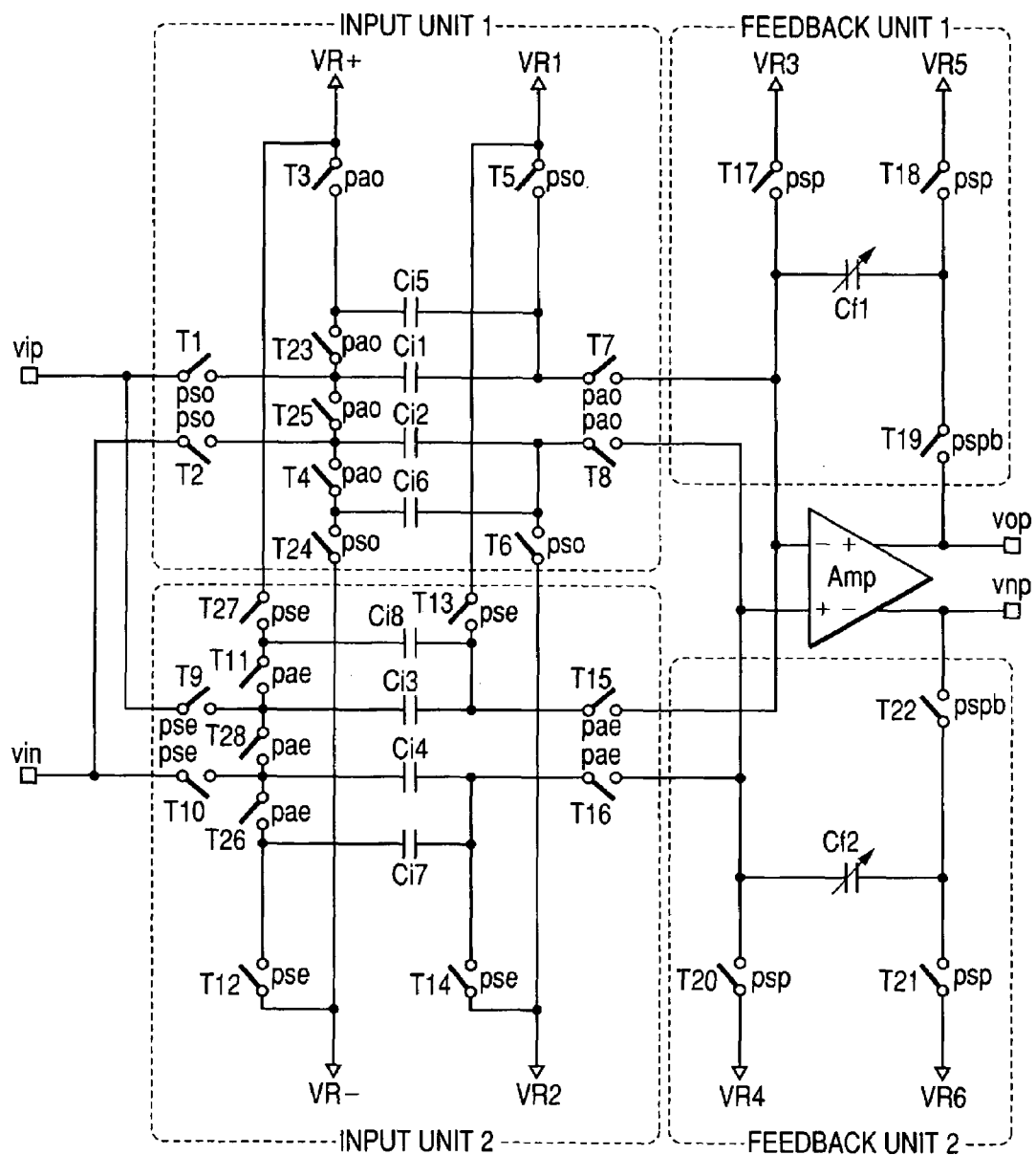
FIG. 5 is a circuit diagram showing another embodiment of the variable gain amplifier circuit according to the invention.

FIG. 5 provides a circuit diagram showing another embodiment of the variable gain amplifier circuit according to the invention. This embodiment adds input capacitors Ci5, Ci6, Ci7, and Ci8 to the circuit in FIG. 1. Further, switches T23 through T27 are added correspondingly to addition of the input capacitors Ci5, Ci6, Ci7, and Ci8. The embodiment adds a function to cancel the offset provided for the differential amplifier circuit Amp. The embodiment performs the amplification by short-circuiting between input terminals of the input capacitors Ci1 through Ci8.

As mentioned above, the input capacitors Ci1 and Ci2 acquire the input signals vip and vin at an odd-numbered timing. The capacitors Ci5 and Ci6 acquire a cancellation signal having the input offset provided for the differential amplifier circuit Amp. Switches T23, T24, and T25 are added to perform these operations. Similarly, the input capacitors Ci3 and Ci4 acquire the input signals vip and vin at an even-numbered timing. The capacitors Ci7 and Ci8 acquire a cancellation signal having the input offset provided for the differential amplifier circuit Amp. Switches T26, T27, and T28 are added to perform these operations.

The control signal pao controls the added switches T23 and T25. The control signal pso controls the switch T24. Differently from FIG. 1, the control signal pso controls the switch T3. Similarly, the control signal pae controls the added switches T26 and T28. The control signal pse controls the switch T27. Differently from FIG. 1, the control signal pse controls the switch T12. The remainder of the construction is similar to FIG. 1.

With reference to the timing chart in FIG. 2, the following describes an operation example of the variable gain amplifier circuit in FIG. 5. At the first timing corresponding to the first cycle of the clock pulse clk, the control signal pse turns on the switches T9, T10, T12, T27, T13, and T14 to sample the input signal sg1 in the input capacitors Ci3 and Ci4. The input signal sg1 is applied the input terminals vip and vin. The capacitors Ci7 and Ci8 sample difference voltages between the reference voltages VR− and VR2 and between VR+ and VR1. The difference voltages between the reference voltages VR− and VR2 and between VR+ and VR1 correspond to correction voltages for canceling the input offset of the differential amplifier circuit Amp. At the first timing, the input unit 1, the feedback units 1 and 2 amplify input signals acquired to the input capacitors Ci1 and Ci2 at the most recent timing and amplify the offset cancellation voltages applied to the input capacitors Ci5 and Ci6.

At the second timing corresponding to the second cycle of the clock pulse clk, the control signal pse turns off the switches T9, T10, T12, T27, T13, and T14. At the same time, the control signal psp turns on the switches T17, T18, T20, and T21. The feedback capacities Cf1 and Cf2 are reset at the reference voltages VR3, VR5, VR4, and VT6. At the same second timing, the control signal psp turns off the switches T17, T18, T20, and T21. The control signal pspb turns on the switches T19 and T22. At the same time, the control signal pae turns on the switches T11, T26, T28, T15, and T16. The offset cancellation voltage acquired to the capacitors Ci7 and Ci8 is added to the input signal sg1 that is acquired at the first timing corresponding to the first cycle of the clock pulse clk. The fully differential amplifier Amp performs amplification.

During this amplification, the switches T11, T28, and T26 short-circuit the input terminal side of the input capacitors Ci3, Ci4, Ci7, and Ci8 to equalize the potential. Since the differential amplifier circuit Amp provides the same potential for both inputs (positive and negative), all the charges added between Ci3, Ci4, Ci7, and Ci8 move to the feedback capacitors Cf1 and Cf2. Correspondingly to the capacity ratios, offset-canceled and amplified voltages vop and von are generated.

At the second timing corresponding to the second cycle of the clock pulse clk, the input unit 2 and feedback units 1 and 2 perform the above-mentioned amplification. Concurrently with this amplification, the control signal pse turns off the switches T9, T10, T12, T27, T13, and T14 to terminate sampling of the input signal sg1. After this sampling, the control signal pso turns on the switches T1, T2, T3, T24, T5, and T6 to sample the input signal sg2 in the input capacitors Ci1 and Ci2. The input signal sg2 is applied to the input terminals vip and vin. The capacitors Ci5 and Ci6 sample offset cancellation voltages, i.e., difference voltages between the reference voltages VR+ and VR1 and between VR− and VR2.

At the first timing corresponding to the third cycle of the clock pulse clk, the control signal pso turns off the switches T1, T2, T3, T24, T5, and T6. At the same time, the control signal psp turns on the switches T17, T18, T20, and T21 similarly to the above. The feedback capacities Cf1 and Cf2 are reset at the reference voltages VR3, VR5, VR4, and VT6. At the same third timing, the control signal psp turns off the switches T17, T18, T20, and T21. The control signal pspb turns on the switches T19 and T22. At the same time, the control signal pao turns on the switches T4, T23, T24, T7, and T8. The offset cancellation voltages acquired to the capacitors) Ci5 and Ci6 are added to the input signal sg2 that is acquired at the second timing corresponding to the second cycle of the clock pulse clk. The fully differential amplifier Amp performs amplification as mentioned above.

At the first timing corresponding to the third cycle of the clock pulse clk, the control signal pso turns off the switches T1, T2, T3, T5, T6, and T24 to terminate sampling of the input signal sg2 concurrently with the amplification by means of the input unit 1 and the feedback units 1 and 2. After the sampling, the control signal pse turns on the switches T9, T10, T13, and T14 to sample the input signal sg3 in the input capacitors Ci3 and Ci4. The input signal sg3 is supplied to the input terminals vip and vin. The capacitors Ci7 and Ci8 sample difference voltages between the reference voltages VR− and VR2 and between VR+ and VR1.

The embodiment enables the offset cancellation by adding the capacitors Ci5 through Ci8 and the switches T23 through T28 and changing control signals for some of the switches. The above-mentioned correction voltage for offset cancellation can be provided by inserting a training operation, for example, that equalizes the input signals vip and vin and sets the reference voltages VR+ and VR− so that the output voltages vop and von become equal to each other at that time. For example, it may be preferable to perform the training operation during a power-on sequence to generate the reference voltages VR+ and VR−. This also applies to the embodiment in FIG. 1 where the offset cancellation voltage is directly added to the reference voltages VR+ and VR−. The variable gain amplifier circuit in FIG. 5 can also operate accordingly to the timing chart in FIG. 3.

Figure 6:
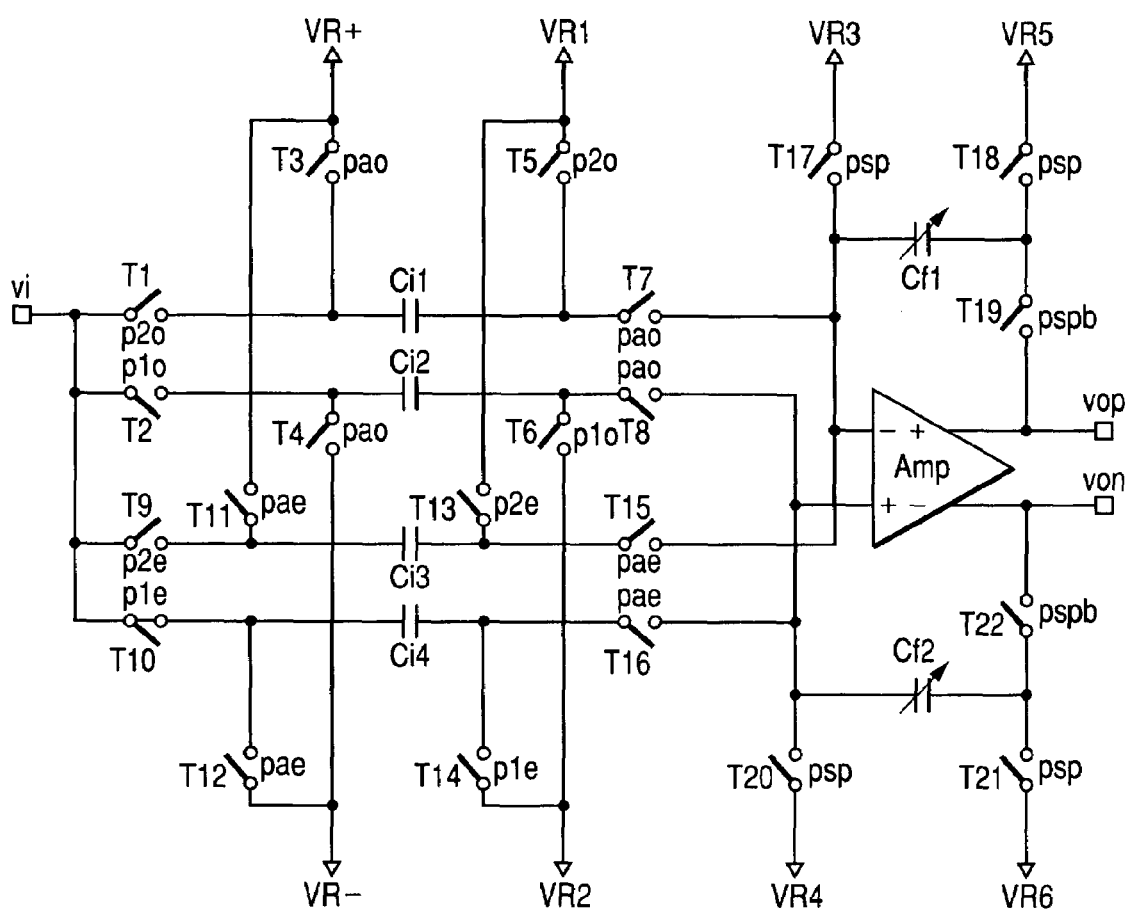
FIG. 6 is a circuit diagram showing an embodiment of applying the variable gain amplifier circuit according to the invention to a correlated double sampling (CDS) amplifier.

FIG. 6 provides a circuit diagram showing an embodiment of applying the variable gain amplifier circuit according to the invention to a correlated double sampling (CDS) amplifier. The circuit configuration in FIG. 6 differs from that in FIG. 1 as follows. The input terminals vip and vin are replaced by a common input terminal vi and the switches T1 through T22 operate at different timings. That is, control signal p2o controls the switches T1 and T5. Control signal p1o controls the switches T2 and T6. Control signal pao controls the switches T3, T4, T7, and T8. Control signal p2e controls the switches T9 and T13. Control signal p1e controls the switches T10 and T14. Control signal pae controls the switches T11, T12, T15, and T16. Control signal psp controls the switches T17, T18, T20, and T22. Control signal pspb controls the switches T19 and T21. The control signal pspb is phased opposite to the control signal psp.

Figure 7:
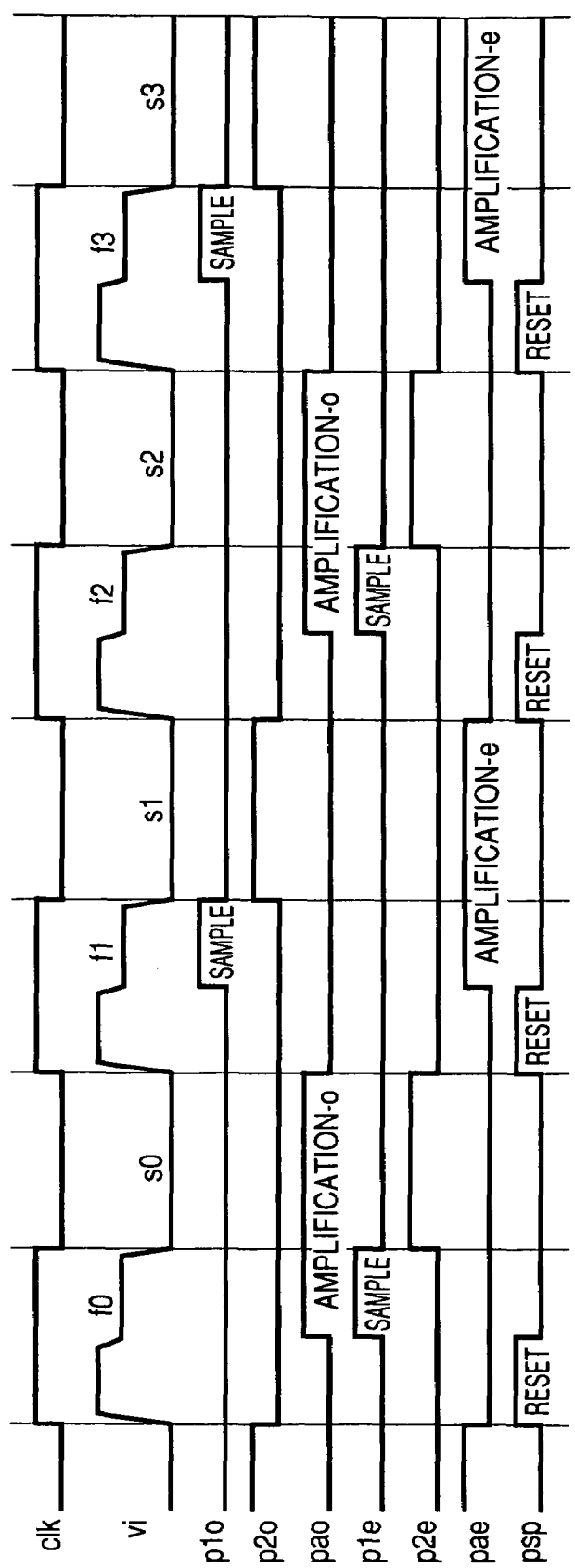
FIG. 7 is a timing chart illustrating an example of operation of the CDS amplifier in FIG. 6.

FIG. 7 provides a timing chart illustrating an example of operation of the CDS amplifier in FIG. 6. During a high-level period corresponding to the first cycle of the clock pulse clk, the control signal p1e turns on the switches T10 and T14 to sample a signal from the image sensor, i.e., reference signal f0 called the field-through portion, in an input capacitor Ci4. During a low-level period of the clock pulse clk, the control signal p2e turns on the switches T9 and T13 to sample the signal portion s0 in an input capacitor Ci3.

During a high-level period corresponding to the second cycle of the clock pulse clk, the control signal p2e turns off the switches T9 and T13. At the same time, the control signal psp turns on the switches T17, T8, T20, and T21 to reset the feedback capacitors Cf1 and Cf2. The control signal psp turns off T17, T8, T20, and T21. At the same time, the control signal pae turns on the switches T11, T12, T15, and T16. A difference between the signals s0 and f0 is added to a difference between the reference voltages VR+ and VR−. The differential amplifier circuit Amp amplifies the result.

During a high-level period corresponding to the second cycle of the clock pulse clk, the control signal p1o turns on the switches T2 and T6 to sample reference signal f1 in an input capacitor Ci2. During a low-level period corresponding to the second cycle of the clock pulse clk, the control signal p2o turns on the switches T1 and T5 to sample a signal portion s1 in an input capacitor Ci1.

During a high-level period corresponding to the third cycle of the clock pulse clk, the control signal p2o turns off the switches T1 and T5. At the same time, the control signal psp turns on the switches T17, T8, T20, and T21 to reset the feedback capacitors Cf1 and Cf2. The control signal psp turns off T17, T8, T20, and T21. At the same time, the control signal pao turns on the switches T3, T4, T7, and T8. A difference between the signals s1 and f1 is added to a difference between the reference voltages VR+ and VR−. The differential amplifier circuit Amp amplifies the result.

During a high-level period corresponding to the third cycle of the clock pulse clk, the control signal p1e turns on the switches T10 and T14 to sample reference signal f2 in an input capacitor Ci4. During a low-level period corresponding to the third cycle of the clock pulse clk, the control signal p2e turns on the switches T9 and T13 to sample a signal portion s1 in an input capacitor Ci3.

At the cycle before the first cycle of the clock pulse clk, the input capacitors Cf1 and Cf2 acquire the reference signal f and the signal portion corresponding to the cycle as mentioned above. At the first cycle timing of the clock pulse clk, the input capacitors Cf1 and Cf2 are reset. The control signal psp then turns off T17, T8, T20, and T21. At the same time, the control signal pao turns on the switches T3, T4, T7, and T8. A difference between the signals s and f is added to a difference between the reference voltages VR+ and VR−. The differential amplifier circuit Amp amplifies the result.

Figure 8:
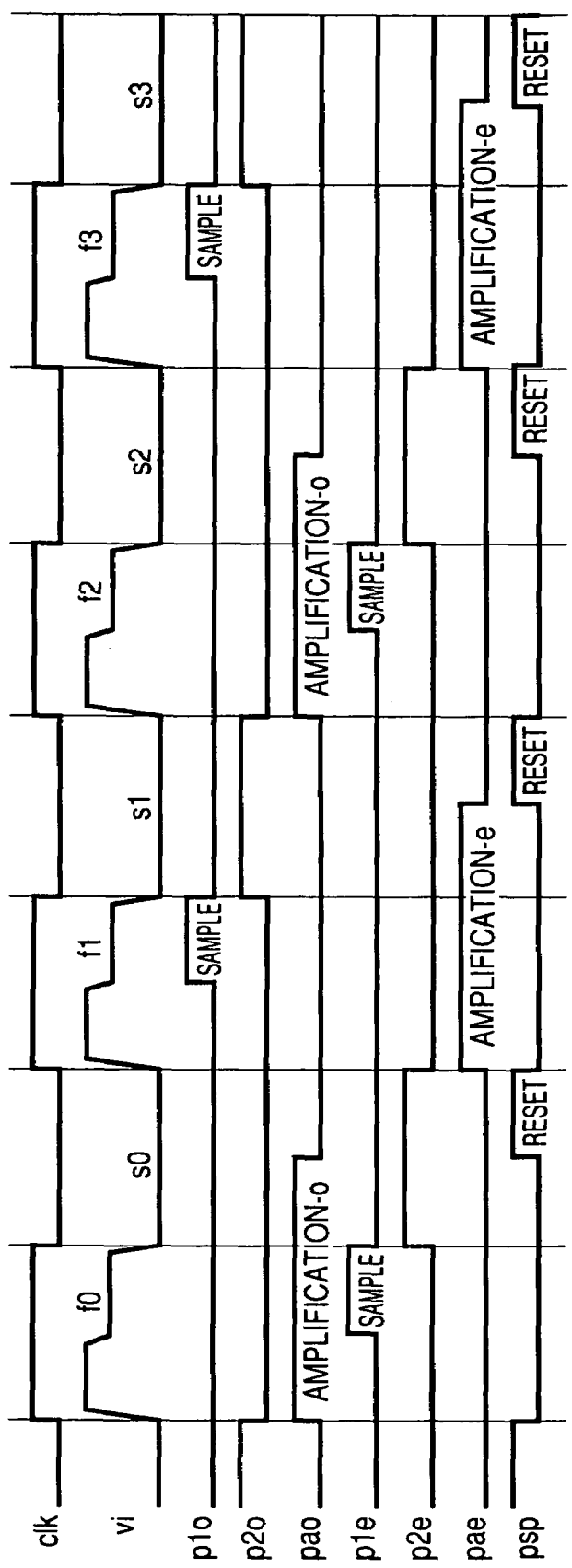
FIG. 8 is a timing chart illustrating another example of operation of the CDS amplifier in FIG. 6.

FIG. 8 provides a timing chart illustrating another example of operation of the CDS amplifier in FIG. 6. Similarly to the timing chart in FIG. 3, the embodiment performs the amplification at a given timing and then resets the feedback capacitors Cf1 and Cf2 so as to be ready for the next amplification. As mentioned above, the embodiment in FIG. 8 performs the amplification and then resets the feedback capacitors Cf1 and Cf2. Accordingly, the amplification can be performed immediately at the next timing. That is, the control signal psp is issued at the end of the clock pulse clk. In response to this, the control signals pao and pae complete the amplification before the control signal psp starts resetting the feedback capacitors Cf1 and Cf2 from the beginning of the clock pulse clk.

Similarly to the above-mentioned PGA, this embodiment also uses the interleave and the shared amplification and enables the CDS amplifier to accelerate the throughput and reduce the power consumption. A variable feedback capacitor may degrade the ratio accuracy for gain setup. Using only one set of the variable feedback capacities can restrain the accuracy from degrading even in the interleave system that contains multiple signal paths. Only one set of feedback capacities can restrain the circuit scale from increasing.

Figure 9:
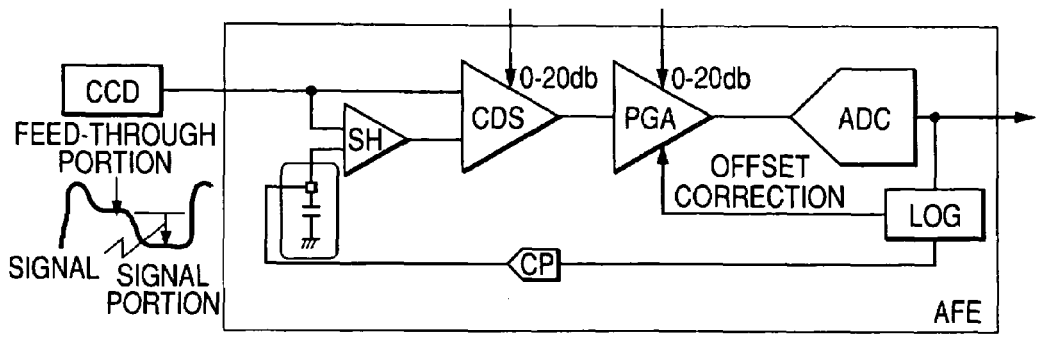
FIG. 9 is a block diagram showing an embodiment of a camera preprocessing LSI according to the invention.

FIG. 9 provides a block diagram showing an embodiment of a camera preprocessing LSI and its peripheral circuits according to the invention. A correlated double sampling amplifier CDS samples the feed-through portion and the signal portion of an image signal generated by an image sensor CCD. The correlated double sampling amplifier CDS extracts and amplifies a difference between the feed-through portion and the signal portion to remove noise. The correlated double sampling amplifier CDS also adds a clamp offset. The above-mentioned PGA amplifies an output from the correlated double sampling amplifier CDS. The analog/digital converter ADC converts the output into a digital code. The digitized image signal is transferred to a logic circuit LOG constituting part of the signal processing and is used for offset correction and control of a charge pump CP.

The analog/digital converter ADC outputs the digitized image signal. This signal is transferred to a digital signal processing circuit. The digital signal processing circuit complements RGB, corrects colors for improved color reproduction, and adjusts the white balance. The logic circuit LOG constituting part of the signal processing corrects an offset based on the digital code supplied from the analog/digital converter ADC. A control circuit sets CDS and PGA gains to specified values. A clock generation circuit generates clocks to operate the camera preprocessing LSI (AFE) and the digital signal processing circuit.

The logic circuit LOG receives the digitally coded image signal generated by the analog/digital converter ADC. The logic circuit LOG controls the charge pump CP to generate a correction voltage for performing the clamp offset (black level correction). A voltage holding capacitor holds this correction voltage. The correction voltage is supplied to the correlated double sampling amplifier CDS via a sample/hold circuit SH. The clamp offset is added to the correction voltage. The correction voltage needs to be held for a period equivalent to at least one line of signal from the image sensor CCD. Though not specified, the capacitor is used to hold the correction voltage.

Figure 10:
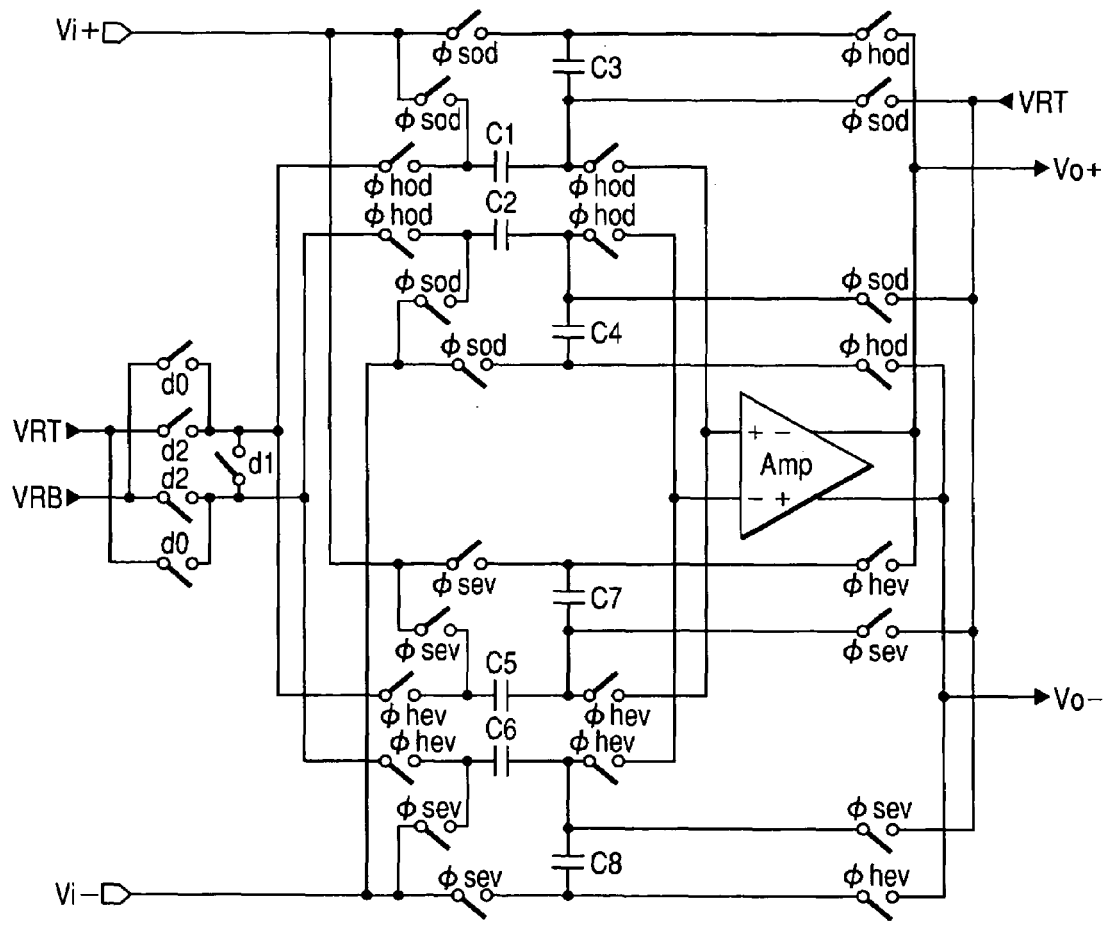
FIG. 10 is a circuit diagram showing an embodiment of an S/H amplifier used for the analog/digital converter ADC in FIG. 9.

FIG. 10 provides a circuit diagram showing an embodiment of a double-gain S/H amplifier used for the analog/digital converter ADC. The embodiment shares an amplifier body Amp and input switches do through d2 for the DAC. The embodiment provides two sets of capacitors and selects them by means of the switches for interleaving. The amplifier body Amp represents a fully differential amplifier and uses two sets of capacitors (condensers) C1 through C4 and C5 through C8 to sample and hold input signals. One set of capacitors include four capacitors. A positive input terminal (+) of the fully differential amplifier Amp connects to the capacitors C1, C3, C5, and C7 via switches. A negative input terminal (−) of the fully differential amplifier Amp connects to the capacitors C2, C4, C6, and C8 via switches. FIG. 10 uses signal names to represent the switches. A timing chart to be described below will clarify changeover of the circuit using the switches.

Figure 11:
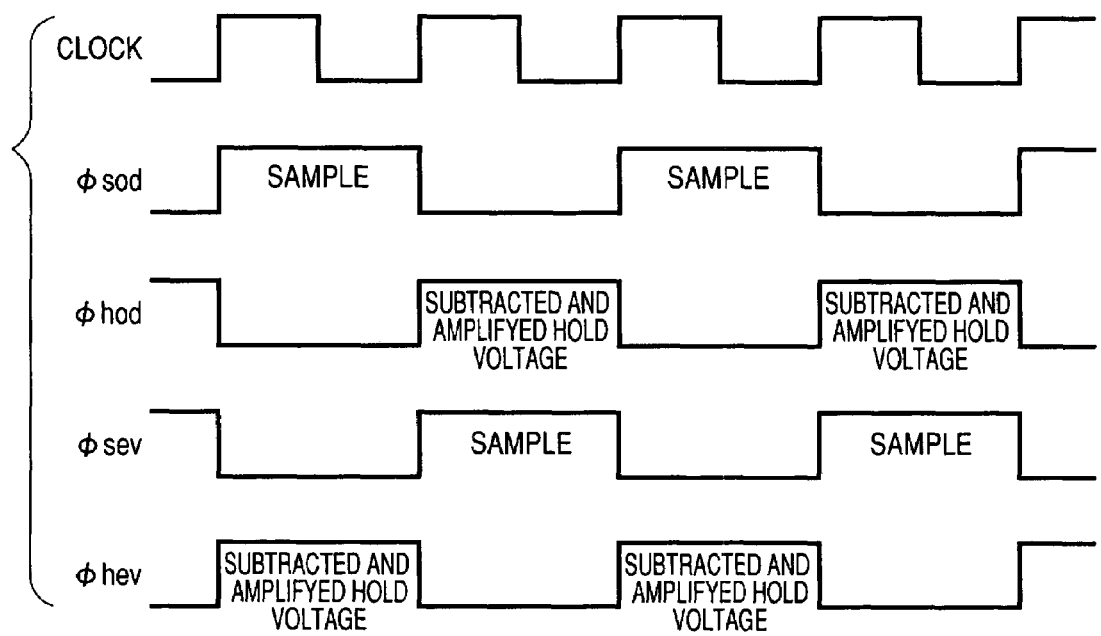
FIG. 11 is an operation timing chart of the S/H amplifier in FIG. 10.

FIG. 11 is an operation timing chart of the S/H amplifier in FIG. 10. The same phase is applied between clock signals $\phi$sod and $\phi$hev and between $\phi$sev and $\phi$hod. The reversed phase is applied between $\phi$sod and $\phi$hod between $\phi$sev and $\phi$hev. Letter s in $\phi$sod and $\phi$sev signifies that the signal is a sampling pulse. Letter h in $\phi$hod and $\phi$hev signifies that the signal is a hold pulse. Letters od in $\phi$sod and $\phi$hod signify that the interleave is odd-numbered. Letters ev in $\phi$sev and $\phi$hev signify that the interleave is even-numbered.

During odd-numbered sampling (clock signals $\phi$sod=1 (high level) and $\phi$hod=0 (low level)), a positive input signal vi+ is supplied to the other terminals of the capacitors C1 and C3. A negative input signal vi− is supplied to the other terminals of the capacitors C2 and C4. The signals are biased to specified voltage VRT at the input terminals (positive and negative) of the fully differential amplifier Amp.

During even-numbered sampling (clock signals $\phi$sev=1 (high level) and $\phi$hev=0 (low level)), a positive input signal vi+ is supplied to the other terminals of the capacitors C5 and C7. A negative input signal vi− is supplied to the other terminals of the capacitors C6 and C8. The signals are biased to specified voltage VRT at the input terminals (positive and negative) of the fully differential amplifier Amp.

During odd-numbered holding (clock signals $\phi$sod=0 (low level) and $\phi$hod=1 (high level)), the other terminals of the capacitors C1 and C2 are connected to a different reference voltage VRT or VRB or are short-circuited to each other, selectively. The other terminals of the capacitors C3 and C4 are connected to the negative terminal (−) and the positive terminal (+) of the fully differential amplifier Amp, respectively.

During even-numbered holding (clock signals φsev=0 (low level) and φhev=1 (high level)), the other terminals of the capacitors C5 and C6 are connected to a different reference voltage VRT or VRB or are short-circuited to each other, selectively. The other terminals of the capacitors C7 and C8 are connected to the negative terminal (−) and the positive terminal (+) of the fully differential amplifier Amp, respectively.

During the odd-numbered holding (clock signals φsod=0 and φhod=1), the DAC function is provided by choosing from three connection states a) VRT and VRB, b) short-circuited, and c) VRB and VRT for the other terminals of the capacitors C1 and C2.

During the even-numbered holding (clock signals φsev=0 and φhev=1), the DAC function is provided by choosing from three connection states a) VRT and VRB, b) short-circuited, and c) VRB and VRT for the other terminals of the capacitors C5 and C6.

The capacitors C1 and C2 accumulate charges during the odd-numbered sampling. The charges accumulated in the capacitors C1 and C2 are respectively transferred to the capacitors C3 and C4 according to the state selected during the hold. In this manner, the subtraction and the amplification are realized simultaneously. Similarly, the capacitors C5 and C6 accumulate charges during the even-numbered sampling. The charges accumulated in the capacitors C5 and C6 are respectively transferred to the capacitors C7 and C8 according to the state selected during the hold. In this manner, the subtraction and the amplification are realized simultaneously.

The S/H amplifier according to the embodiment performs an interleave operation where one side (odd-numbered or even-numbered side) performs a sampling operation while the other side (even-numbered or odd-numbered side) performs a hold operation. In this manner, the amplifier speed is relieved to decrease the power consumption. That is, the higher capacitors C1 through C4 are connected to the amplifier body Amp for amplification. At this time, the lower capacitors C5 through C8 are disconnected from the amplifier body Amp to start sampling. Alternately repeating this operation allows the amplifier Amp to always perform the amplification. The amplification time becomes double that of an S/H amplifier that is not interleaved. As a result, the speed of the amplifier Amp can be halved, making it possible to decrease a consumption current.

Figure 12:
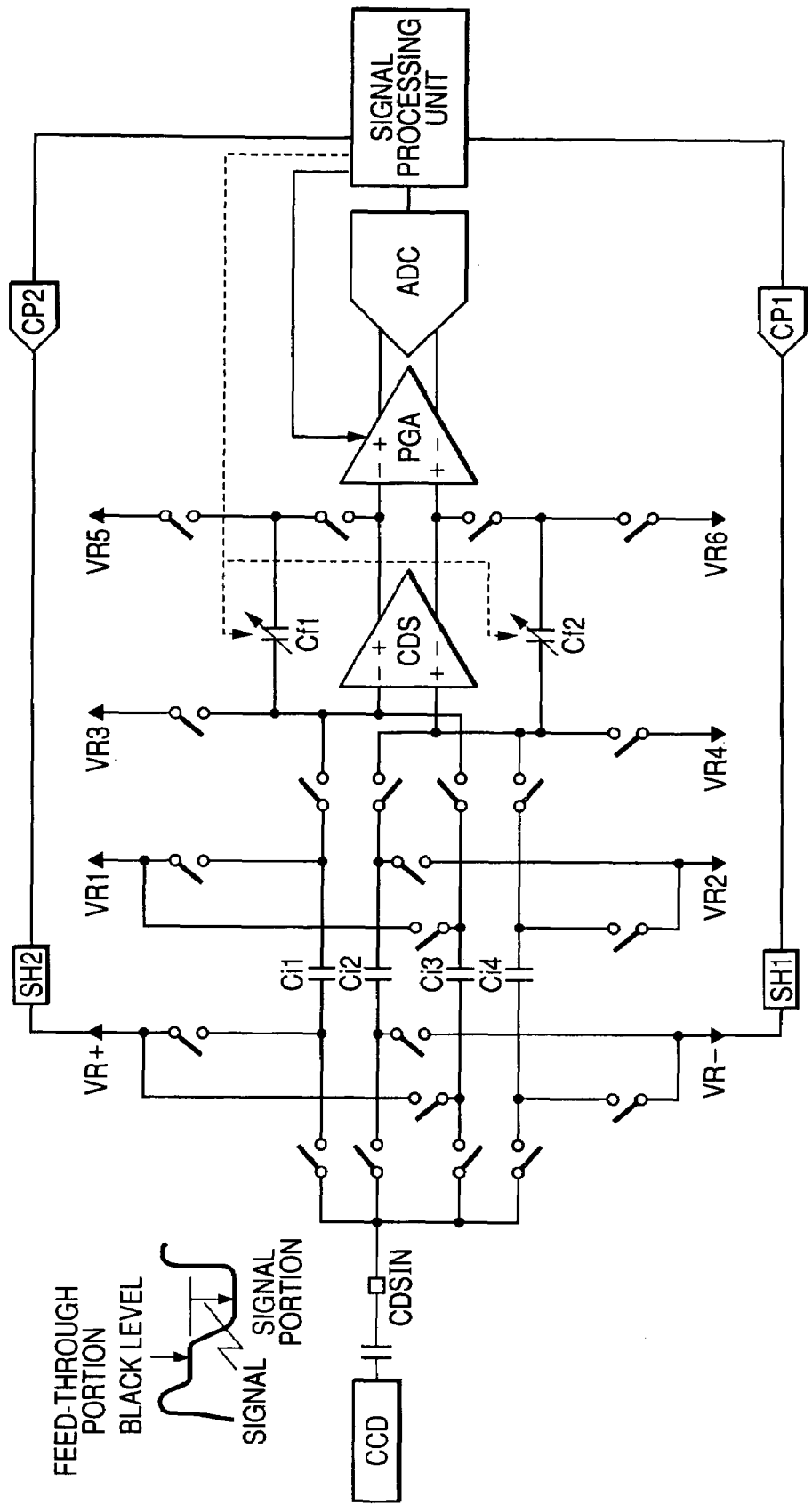
FIG. 12 is a configuration diagram showing another embodiment of the camera preprocessing LSI according to the invention.

FIG. 12 provides a configuration diagram showing another embodiment of the camera preprocessing LSI according to the invention. According to the embodiment, a signal generated from a signal processing unit controls charge pumps CP1 and CP2 each of which half generates a correction voltage for the above-mentioned clamp offset (black level correction). The correction voltage is supplied to each of voltage holding circuits SH1 and SH2. The voltages are supplied to the bias voltage terminals VR+ and VR− to perform the addition as mentioned above and correct the black level. A gain control signal generated from the signal processing unit controls the switches SW1 through SWn as shown in FIG. 4. The CDS and PGA gains are controlled so as to be 0 through 20 db as shown in FIG. 9, for example.

The correlated double sampling amplifier CDS according to the invention interleaves the subsequent PGA and analog/digital converter ADC so that the same clock pulse clk can be used to control them. The speed can be halved, making it possible to decrease a consumption current. Generally, the analog/digital converter ADC consumes most part of the power for the camera preprocessing LSI (AFE). Since the analog/digital converter ADC can be configured to consume low power without sacrificing the accuracy, it is possible to improve the AFE accuracy and greatly decrease the power consumption. Since the CDS amplifier body is provided with two sets of capacitors to be interleaved, the amplifier can always perform amplification. When the sampling time equals the holding time, the amplification time becomes double the time for an uninterleaved construction. In this manner, the amplifier speed can be halved. The amplifier speed is proportional to conductance gm of the amplifier's input transistor itself and gm is proportional to a square root of the current. When the speed becomes half, the current becomes quarter.

Even when the same noise is applied to holding voltages for the voltage holding circuits VHD1 and VHD2, the correlated double sampling amplifier CDS according to the construction performs the above-mentioned differential amplification and can cancel the noise. That is, it is possible to cancel a common-mode noise if applied to the correction voltage that is held for a period equivalent to at least one line as mentioned above. The use of such method for clamp offset correction (black level correction) can make available the camera preprocessing LSI featuring improved noise resistance.

While there have been described specific preferred embodiments of the invention made by the inventors, it is to be distinctly understood that the invention is not limited there to but may be otherwise variously embodied within the spirit and scope of the invention. For example, the digital signal processing circuit such as the DSP to process digital signals may implement part of the gain control function of the PGA. Specific constructions of the differential amplifier circuit can be variously embodied. The invention can be widely applied to not only the CDS amplifier and the PGA, but also various semiconductor integrated circuit devices provided with a variable gain amplifier circuit.

What is claimed is:

1. A semiconductor integrated circuit device comprising:
   a first input capacitor;
   a second input capacitor;
   a feedback capacitor composed of a variable capacitor device; and
   an amplifier circuit,
   wherein, at first timing, the first input capacitor acquires a first signal, and the amplifier circuit amplifies the second signal acquired to the second input capacitor according to a gain corresponding to a capacity ratio between the second input capacitor and the feedback capacitor,
   wherein, at second timing, the second input capacitor acquires a second signal, and the amplifier circuit amplifies the first signal according to a gain corresponding to a capacity ratio between the first input capacitor and the feedback capacitor, and
   wherein a variable gain amplifier circuit interleavingly amplifies the first signal and the second signal in accordance with the first timing and the second timing.

2. The semiconductor integrated circuit device according to claim 1, wherein the feedback capacitor is capable of variable capacitance values since a switch device selectively connects a plurality of capacitor devices in a parallel mode.

3. The semiconductor integrated circuit device according to claim 2,
wherein the amplifier circuit is provided with differential input and differential output,
wherein the first and second input capacitors include two pairs of capacitors corresponding to differential input, and
wherein the feedback capacitor includes two pairs of variable capacitors corresponding to the differential input and output.

4. The semiconductor integrated circuit device according to claim 3,
wherein the first timing and the second timing have timing to reset the feedback capacitor before the amplifier circuit starts amplification or after the amplifier circuit completes amplification.

5. The semiconductor integrated circuit device according to claim 4,
wherein a switch comprised of MOSFET is used for switching between acquiring and amplifying an input signal to first and second input capacitors at the first and second timings and between an amplification operation and a reset operation using the feedback capacitor, and
wherein a MOSFET to reset the feedback capacitor is sized large enough to have an on-resistance value smaller than that for MOSFET used for the other switches.

6. The semiconductor integrated circuit device according to claim 4,
wherein the amplifier circuit constructs a correlated double sampling circuit that samples and holds a signal corresponding to a black level of a feed-through portion of a pixel signal generated in a solid-state image sensor and generates an output signal corresponding to a difference signal between the feed-through portion and a signal portion of the pixel signal,
wherein the first timing includes a first period and the second timing includes a second period,
wherein the first signal corresponds to a black level of the feed-through portion in the first period and a level of a signal portion for the pixel signal immediately after the first period, and
wherein the second signal corresponds to a black level of the feed-through portion in the second period and a level of a signal portion for the pixel signal immediately after the second period.

7. The semiconductor integrated circuit device according to claim 6 further comprising:
a variable amplifier circuit,
wherein the amplifier circuit of the variable amplifier circuit receives a differential signal of the correlated double sampling circuit, and
wherein the first and second signals input to the variable amplifier circuit are pixel signals chronologically output from the correlated double sampling circuit.

8. The semiconductor integrated circuit device according to claim 7 further comprising:
an A/D converter circuit;
a logical circuit that receives an output signal from the A/D converter circuit and feeds back a black level clamp signal to the correlated double sampling circuit; and
a voltage holding circuit that holds the black level clamp signal,
wherein the A/D converter circuit includes a sample/hold circuit that performs an interleave operation synchronized with an amplification output operation of the variable amplifier circuit.

9. The semiconductor integrated circuit device according to claim 8,
wherein a black level clamp signal generated in the voltage holding circuit is supplied to reference voltage sides of the first and second input capacitors of the amplifier circuit constituting the correlated double sampling circuit.

10. The semiconductor integrated circuit device according to claim 9,
wherein the black level clamp signal is fed back as reverse polarities to input capacitors corresponding to a positive input terminal and a negative input terminal of the amplifier circuit.

11. The semiconductor integrated circuit device according to claim 7,
wherein an offset adjustment voltage is synchronized with acquisition timings of the first and second signals and is acquired to the first and second input capacitors of the amplifier circuit constituting the variable amplifier circuit, and
wherein the semiconductor integrated circuit device further comprises first and second offset adjustment capacitors that are parallel connected to the first and second input capacitors correspondingly to the amplification operation.

* * * * *